(12) United States Patent
Chen

(10) Patent No.: US 8,106,692 B2
(45) Date of Patent: Jan. 31, 2012

(54) METHOD FOR TRACKING DELAY LOCKED LOOP CLOCK

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 199 days.

(21) Appl. No.: 12/717,104

(22) Filed: Mar. 3, 2010

(65) Prior Publication Data

US 2011/0215850 A1  Sep. 8, 2011

(51) Int. Cl.
*H03L 7/06* (2006.01)

(52) U.S. Cl. ......... 327/158; 327/149; 327/150; 327/159

(58) Field of Classification Search ............ 327/141, 327/144–163; 331/1 A, 15–17; 375/373–376
See application file for complete search history.

(56) References Cited

U.S. PATENT DOCUMENTS

| | | | |
|---|---|---|---|
| 6,411,142 B1 * | 6/2002 | Abbasi et al. | 327/156 |
| 6,867,626 B2 | 3/2005 | Idei | |
| 7,046,060 B1 * | 5/2006 | Minzoni et al. | 327/158 |
| 7,336,112 B1 | 2/2008 | Sha et al. | |
| 2001/0033630 A1 * | 10/2001 | Hassoun et al. | 375/376 |
| 2004/0169537 A1 * | 9/2004 | Abbasi et al. | 327/158 |
| 2006/0087353 A1 * | 4/2006 | Minzoni et al. | 327/158 |
| 2008/0189568 A1 * | 8/2008 | Kwak | 713/501 |
| 2008/0238652 A1 | 10/2008 | Henzler et al. | |
| 2011/0215850 A1 * | 9/2011 | Chen | 327/158 |

* cited by examiner

*Primary Examiner* — Lincoln Donovan
*Assistant Examiner* — Brandon s Cole
(74) *Attorney, Agent, or Firm* — Jianq Chyun IP Office

(57) ABSTRACT

A method for tracking a delay locked loop (DLL) clock is described. An external clock signal is allowed to pass through delay cells of a DLL during a first period of the external clock signal when a transition edge of a track signal applied on the DLL occurs. Then, when a transition edge of a sensing signal applied on the DLL occurs at a start of a second period of the external clock signal, the external clock signal is inhibited to pass through the delay cells and the number of the delay cells through which the external signal pass during the first period of the external clock signal is counted. When a reset signal is asserted, a delay time of each delay cell is reset such that a ratio of the delay time to the period of the external clock signal is kept from 10% to 15%.

18 Claims, 5 Drawing Sheets

METHOD FOR TRACKING DELAY LOCKED LOOP CLOCK

BACKGROUND OF THE INVENTION

1. Field of the Invention

The invention relates to a method for tracking a clock, and more particularly, to a method for tracking a delay locked loop (DLL) clock.

2. Description of Related Art

A delay lock loop (DLL) processes a reference clock signal to generate a sequence of delayed clock signals. The frequency and period of the reference clock signal are the same as those of each of the generated clock signals except each delayed clock signal is phase shifted by a common delay time from the previous delayed clock signal. When operating properly, the DLL provides delay clock signals with positive edge transitions that span a single period of the reference clock signal. Initially, the delay time of each of delay cells may be set to a fixed delay time whatever the reference clock signal is. Over time, the fixed delay time results in a sequence of delayed clock signals that may or may not span a single period of the reference clock signal. When the DLL converges on an improper delay time, it is falsely locked. In general, once the reference clock signal is slow down, more delay cells will be used to lock the reference clock signal and hence results in more power consumption.

SUMMARY OF THE INVENTION

The invention provides a method for tracking a delay locked loop (DLL) clock such that the delay time of a delay cell is able to be set and a ratio of the delay time to the period of a clock signal is kept within a range and the power consumption of the DLL is controlled.

The invention provides a method for tracking a delay locked loop (DLL) clock and adapted to a DLL. The method includes following steps. First, an external clock signal is allowed to pass through delay cells of the DLL during a first period of the external clock signal when a first transition edge of a track signal applied on the DLL occurs. Then, when a first transition edge of a sensing signal applied on the DLL occurs at a start of a second period of the external clock signal, the external clock signal is inhibited to pass through the delay cells of the DLL and the number of the delay cells through which the external signal pass during the first period of the external clock signal is counted. Next, when a reset signal is asserted, a delay time of each of the delay cells is reset such that a ratio of the delay time to the first period of the external clock signal is kept within a range. Furthermore, whether the reset signal is asserted is triggered by the first transition edge of the sensing signal and the range is from 10% to 15%.

In an embodiment of the invention, the first transition edge of the sensing signal occurs at a start of the second period of the external clock signal and a second transition edge of the sensing signal occurs during the second period of the external clock signal. Besides, a second transition edge of the track signal occurs at the start of the second period of the external clock signal, and the first transition edge of the track signal occurs at the end of the second period of the external clock signal. And the reset signal is not asserted at the end of the second period of the external clock signal.

In an embodiment of the invention, when the first transition edge of the track signal is a falling edge, the second transition edge of the track signal is a rising edge. Or when the first transition edge of the track signal is a rising edge, the second transition edge of the track signal is a falling edge.

In an embodiment of the invention, when the first transition edge of the sensing signal is a falling edge, the second transition edge of the sensing signal is a rising edge. Or when the first transition edge of the sensing signal is a rising edge, the second transition edge of the sensing signal is a falling edge.

In an embodiment of the invention, when the reset signal is at a logic high level state during the second period of the external clock signal, the reset signal is at a logic low level state during the first period of the external clock signal. Or when the reset signal is at the logic low level state during the second period of the external clock signal, the reset signal is at the logic high level state during the first period of the external clock signal.

In an embodiment of the invention, each of the delay cells receives a voltage signal to reset the delay time thereof.

In an embodiment of the invention, the method further includes following steps. The external clock signal is allowed to pass through the delay cells of the DLL during a third period of the external clock signal. Then, when the first transition edge of the sensing signal applied on the DLL occurs at a start of a fourth period of the external clock signal, the number of the delay cells through which the external clock signal pass during the third period of the external clock signal is counted. Finally, the delay time of each of the delay cells is fine tuned during the fourth period of the external clock signal, such that a ratio of the delay time to the third period of the external clock signal is kept within a range which is from 10% to 15%.

In an embodiment of the invention, when the external clock signal passes through one of the delay cells, an output signal of the delay cell is changed from a logic low level state to a logic high level state if the output signal is initially at the logic low level stated. Or when the external clock signal passes through one of the delay cells, an output signal of the delay cell is changed from a logic high level state to a logic low level state if the output signal is initially at the logic high level state.

The invention also provides a method for tracking a delay locked loop (DLL) clock and adapted to a DLL The method includes following steps. First, an external clock signal is allowed to pass through delay cells of the DLL during a first period of the external clock signal when a first transition edge of a track signal applied on the DLL occurs. Then, when a first transition edge of a sensing signal applied on the DLL occurs at a start of a second period of the external clock signal and a $x^{th}$ delay cell of the delay cells is remained at a first state during the first period of the external clock signal, the external clock signal is inhibited to pass through the delay cells of the DLL, wherein x is an integer larger than 5. Next, when a reset signal is asserted, a delay time of each of the delay cells is reset such that a ratio of the delay time to the first period of the external clock signal is kept within a range. Furthermore, whether the reset signal is asserted is triggered by the first transition edge of the sensing signal and the state of the $x^{th}$ delay cell during the first period of the external clock signal, and above-mentioned range is from 10% to 15%.

Based on the above, the method for tracking a delay locked loop (DLL) clock resets the delay time of each of the delay cells of the DLL during a certain period of the external clock, such that the ratio of the delay time to the period of the external clock is kept within the range from 10% to 15%. As a result, a DLL using the method is able to lock the external clock signal accurately and the power consumption of the DLL is saved as well.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1:
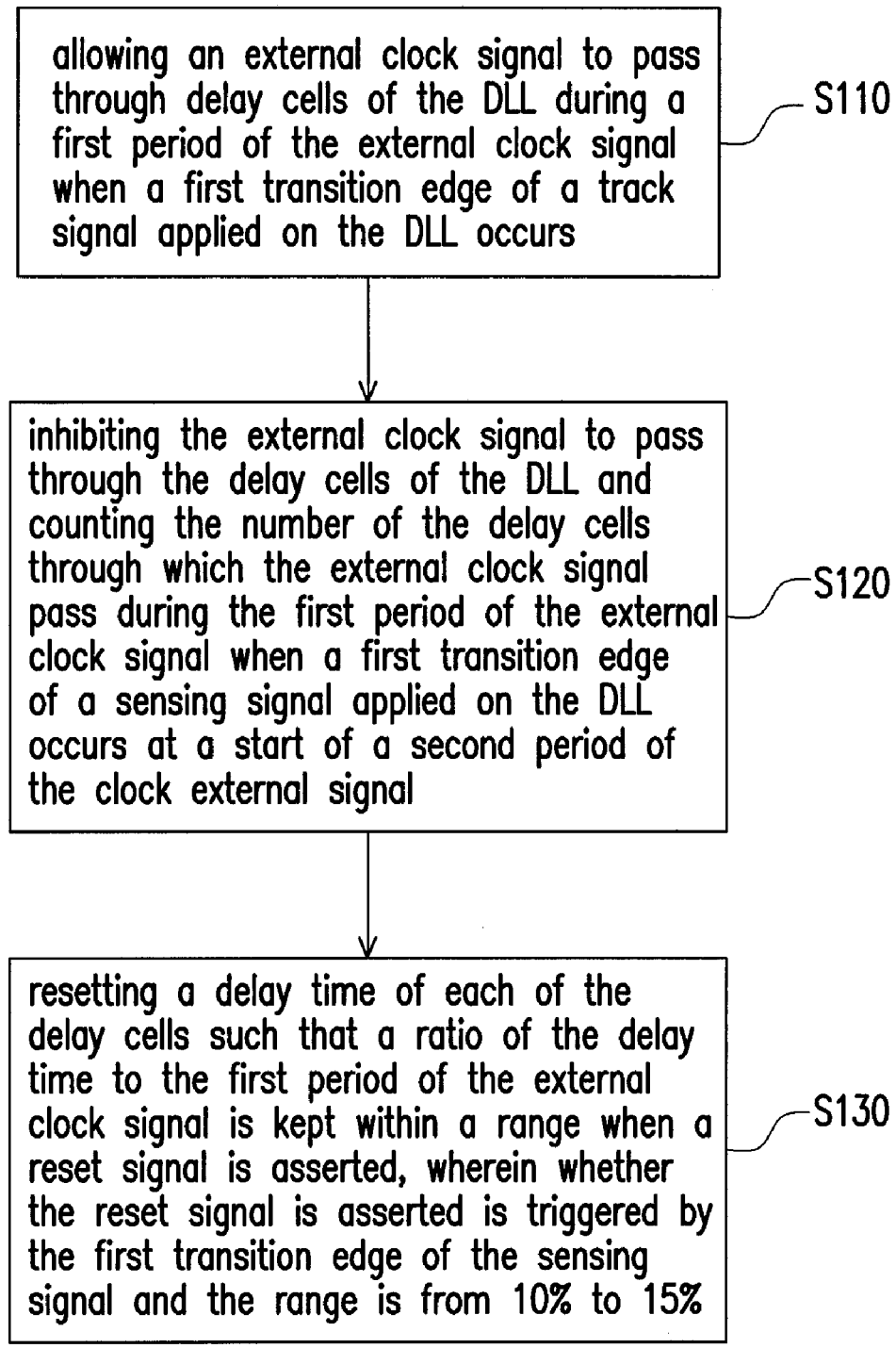
FIG. 1 is a flow chart of a method for tracking a delay locked loop (DLL) clock according to an embodiment of the invention.
Figure 2A:
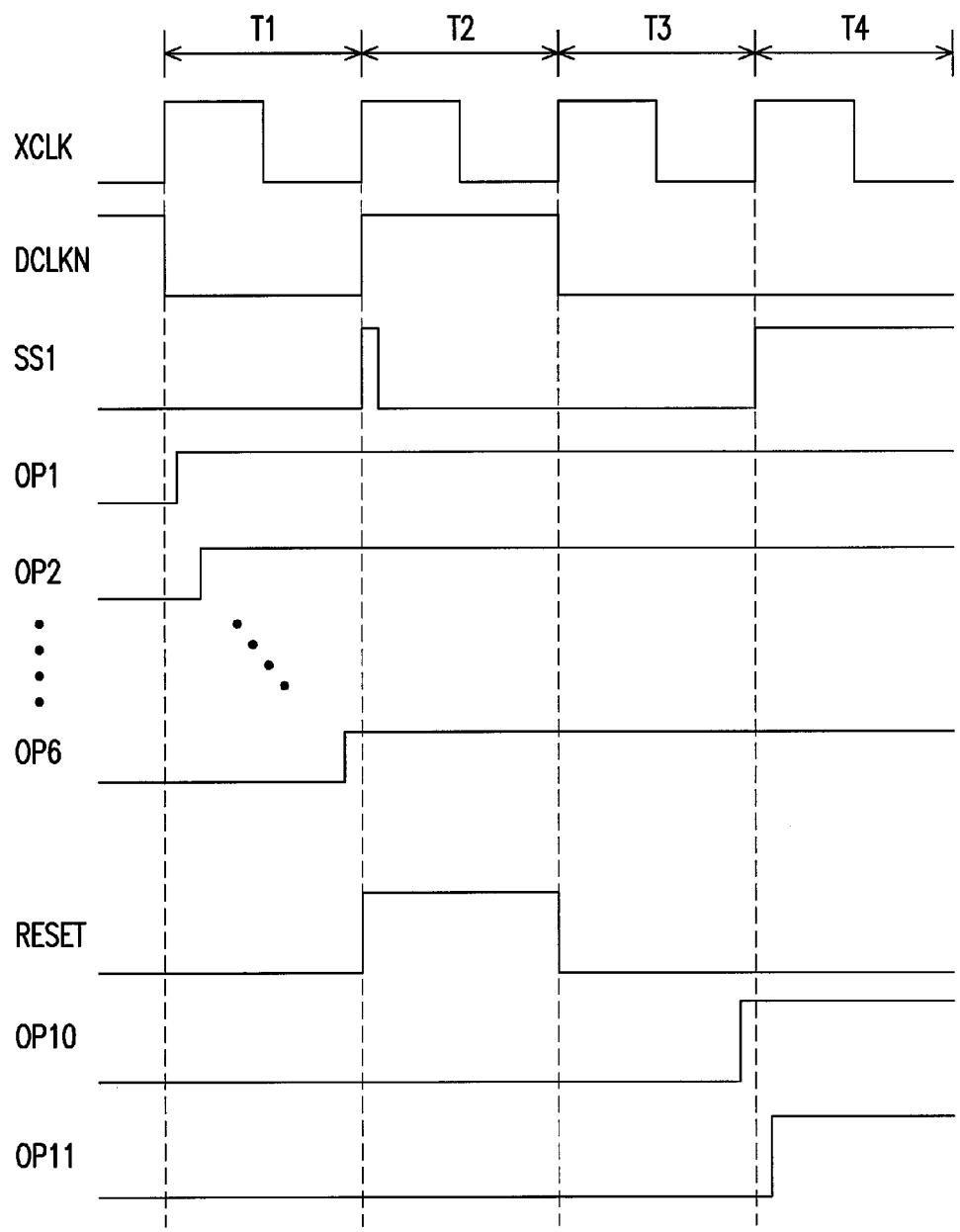
FIG. 2A is a timing chart for illustrating the operation of the method according to FIG. 1.

FIG. 1 is a flow chart of a method for tracking a delay locked loop (DLL) clock according to an embodiment of the invention. FIG. 2A is a timing chart for illustrating the operation of the method according to FIG. 1. Referring to both FIG. 1 and FIG. 2A, the method for tracking a DLL clock and adapted to a DLL includes following steps. First, an external clock signal XCLK is allowed to pass through delay cells of the DLL during a first period T1 of the external clock signal XCLK when a first transition edge of a track signal DCLKN applied on the DLL occurs (step S110). In the embodiment, the first transition edge of the track signal DCLKN is a falling edge as shown in FIG. 2A. However, the first transition edge of the track signal DCLKN may be a rising edge in another embodiment.

Referring to FIG. 2A, when the external clock signal XCLK passes through one of the delay cells, an output signal, e.g. OP1, of the delay cell is changed from a logic low level state to a logic high level state if the output signal of the delay cell is initially at the logic low level state. In another embodiment, when the external clock signal XCLK passes through one of the delay cells, an output signal, e.g. OP1, of the delay cell is changed from a logic high level state to a logic low level state if the output signal of the delay cell is initially at the logic high level state. In the embodiment provided by FIG. 2A, the delay cell may be constituted of two inverters, but the present invention is not limited thereto.

Then, when a first transition edge of a sensing signal SS1 applied on the DLL occurs at a start of a second period T2 of the external clock signal XCLK, the external clock signal XCLK is inhibited to pass through the delay cells of the DLL and the number of the delay cells through which the external clock signal XCLK pass during the first period T1 of the external clock signal XCLK is counted (step S120). For example, as shown in FIG. 2A, when there are 6 delay cells which respectively have output signals OP1~OP6 changed from a logic low level state to a logic high level state during the first period T1 of the external clock signal XCLK, the number of the delay cells through which the external clock signal XCLK pass during the first period T1 of the external clock signal XCLK is 6.

Next, after step S120 is executed, a delay time of each of the delay cells is reset when a reset signal RESET is asserted, e.g. a logic high level state, during the second period T2 of the external clock signal XCLK. As a result, a ratio of the delay time to the first period T1 of the external clock signal XCLK is able to be kept within a range, wherein whether the reset signal RESET is asserted is triggered by the first transition edge of the sensing signal SS1 and the range is from 10% to 15% according to an empirical rule (step S130).

To put it concretely, if the delay time of each of the delay cells is 2 ns and there are 6 delay cells through which the external clock signal XCLK pass during the first period T1 of the external clock signal XCLK, then the period of the external clock signal XCLK is 2 ns×6=12 ns. Hence, the delay time of the each of the delay cells is reset to about 1.2 ns, such that the ratio of the delay time to the period of the external clock signal XCLK is able to be kept within the range 10% to 15%. That is the delay time of the each of the delay cells is reset according to the number of the delay cells through which the external clock signal XCLK passes during the first period T1 of the external clock signal XCLK.

According to the empirical rule, when the ratio of the delay time to the period of the external clock signal XCLK is kept from 10% to 15%, the DLL including several delay cells is able to lock the external clock signal XCLK accurately. More specifically, if each of the delay cells has a long delay time, the locking may fail since the summation of an internal delay time and the delay times of the delay cells is over the external clock signal XCLK. On the other hand, if the delay cell has a short delay time, the number of the delay cells is required more and hence results in more power consumption.

Accordingly, after step S130 is carried out, the number of the delay cells is able to be remained about 10 stages. For example, when the frequency of the external clock signal XCLK is 1 GHz (i.e. the period of the external clock signal XCLK is 1 ns), the delay time of each of the delay cells may be adjusted to 0.1 ns and the number of the delay cells is remained 10 stages. When the frequency of the external clock signal XCLK is 1~1/1.2 GHz, the delay time of the delay cell may be adjusted to 0.1 ns as well and the number of the delay cells is 12 stages. When the frequency of the external clock signal XCLK is 1/1.2~1/1.5 GHz, the delay time of the delay cell may be adjusted to 0.12 ns and the number of the delay cells is 10~13 stages. On the other side, when the frequency of the external clock signal XCLK is 1/1.5~1/1.75 GHz, the delay time of the delay cell may be adjusted to 0.15 ns and the number of the delay cells is 10~12 stages. Or when the frequency of the external clock signal XCLK is 1/1.7~1/2 GHz, the delay time of the delay cell may be adjusted to 0.175 ns and the number of the delay cells is 10~12 stages. Then, the number of the delay cells is remained about 10 stages after step S130 is executed.

Furthermore, the delay time of each of the delay cells is reset during the second period T2 of the external clock signal XCLK when the reset signal RESET is asserted. And the reset signal RESET is not asserted at the end of the second period T2 of the external clock signal XCLK in the embodiment. As shown in FIG. 2A, the reset signal RESET is at a logic high level state during the second period T2 of the external clock signal XCLK and at a logic low level state during first period T1 of the external clock signal XCLK. However, in another embodiment, the reset signal RESET may be at the logic low level state during the second period T2 of the external clock signal XCLK and at the logic high level state during the first period T1 of the external clock signal XCLK.

Referring to FIG. 2A, the first transition edge of the sensing signal SS1 occurs at a start of the second period T2 of the external clock signal XCLK, and a second transition edge of the sensing signal SS1 occurs during the second period of the external clock signal XCLK. And the first transition edge of the sensing signal SS1 is a rising edge, and the second transition edge of the sensing signal is a falling edge as shown in FIG. 2A. Alternatively, the first transition edge of the sensing signal SS1 may be a falling edge, and the second transition edge of the sensing signal SS1 may be a rising edge in another embodiment.

Moreover, a second transition edge of the track signal DCLKN occurs at the start of the second period T2 of the external clock signal XCLK, and the first transition edge of the track signal DCLKN occurs at the end of the second period T2 of the external clock signal XCLK. Besides, the first transition edge of the track signal DCLKN of the embodiment is a falling edge, and the second transition edge of the track signal DCLKN is a rising edge. Alternatively, the first transition edge of the track signal DCLKN may be a rising edge, and the second transition edge of the track signal DCLKN is able to be a falling edge in another embodiment.

Since the number of the delay cells is remained about 10 stages, to avoid the failure in tracking the DLL clock, the output signal OPx of the $x^{th}$ delay cell is also checked while the first transition edge of the sensing signal SS1 occurs at the start of the second period T2 of the external clock signal XCLK, wherein x is an integer. In the embodiment, x is, for example, larger than 5.

Figure 2B:
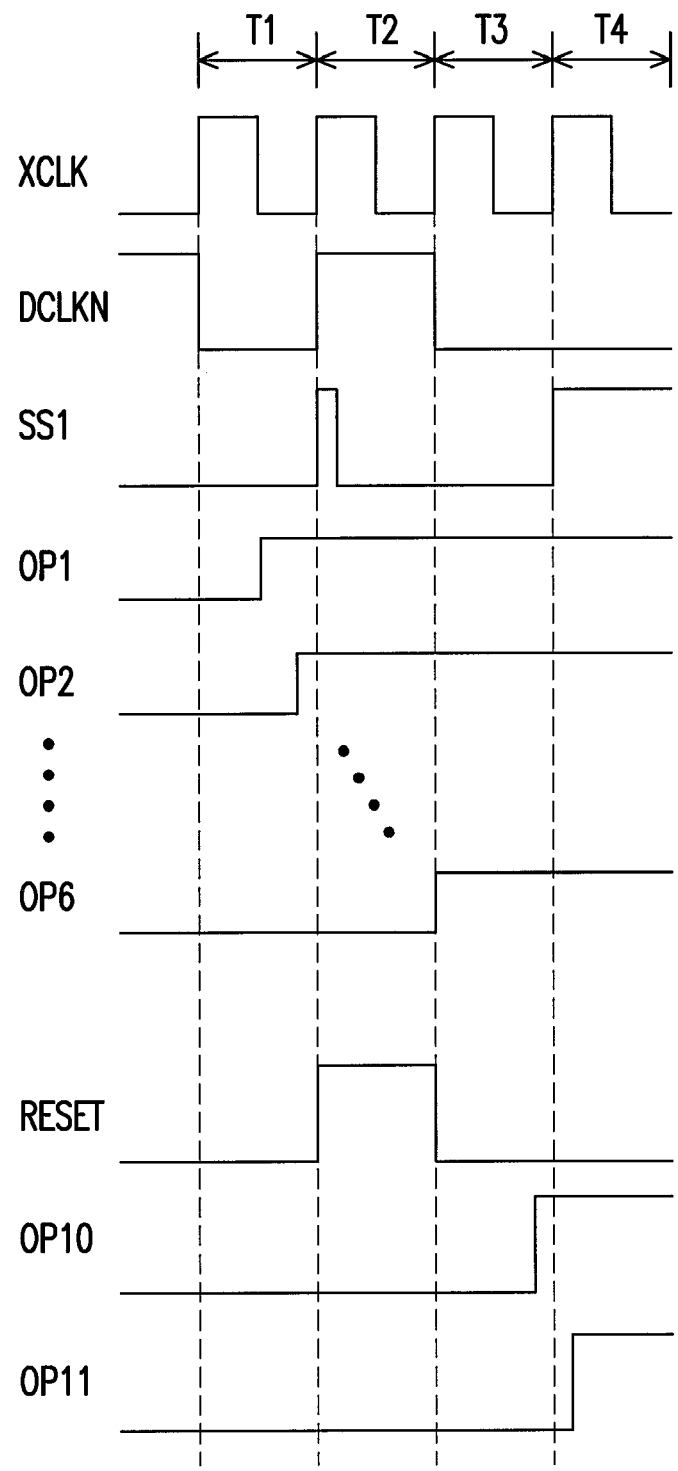
FIG. 2B is another timing chart for illustrating the operation of a method for tracking a DLL clock according to another embodiment.

FIG. 2B is another timing chart for illustrating the operation of a method for tracking a DLL clock according to another embodiment. Referring to both FIG. 2A and FIG. 2B, the main difference between FIG. 2A and FIG. 2B lies that the clock rate of the external clock signal XCLK in FIG. 2B is faster than that in FIG. 2A. As shown in FIG. 2B, since the clock rate of the external clock signal XCLK is too fast, only few delay cells through which the external clock signal XCLK pass during the first period T1 of the external clock signal XCLK. Thus, in order to avoid the failure in tracking the DLL clock, the output signal OPx of the $x^{th}$ delay cell, e.g. OP6 in FIG. 2B, is also checked when the first transition edge of the sensing signal SS1 occurs at the start of the second period T2 of the external clock signal XCLK. In the embodiment, the $x^{th}$ delay cell is remained at a logic low level state during the first period T1 of the external clock signal XCLK. Hence, the reset signal RESET is then triggered by the first transition edge of the sensing signal SS1 and the low level state of the output signal OPx of the $x^{th}$ delay cell during the first period T1 of the external clock signal XCLK. As a result, the reset signal RESET is asserted and the delay time of each of the delay cells is reset during the second period T2 of the external clock signal XCLK, such that the ratio of the delay time to the first period of the external clock signal is kept within 10% to 15%. Since the detailed process can be understood according to the above description together with FIG. 2A, further description is omitted herein.

Figure 3:
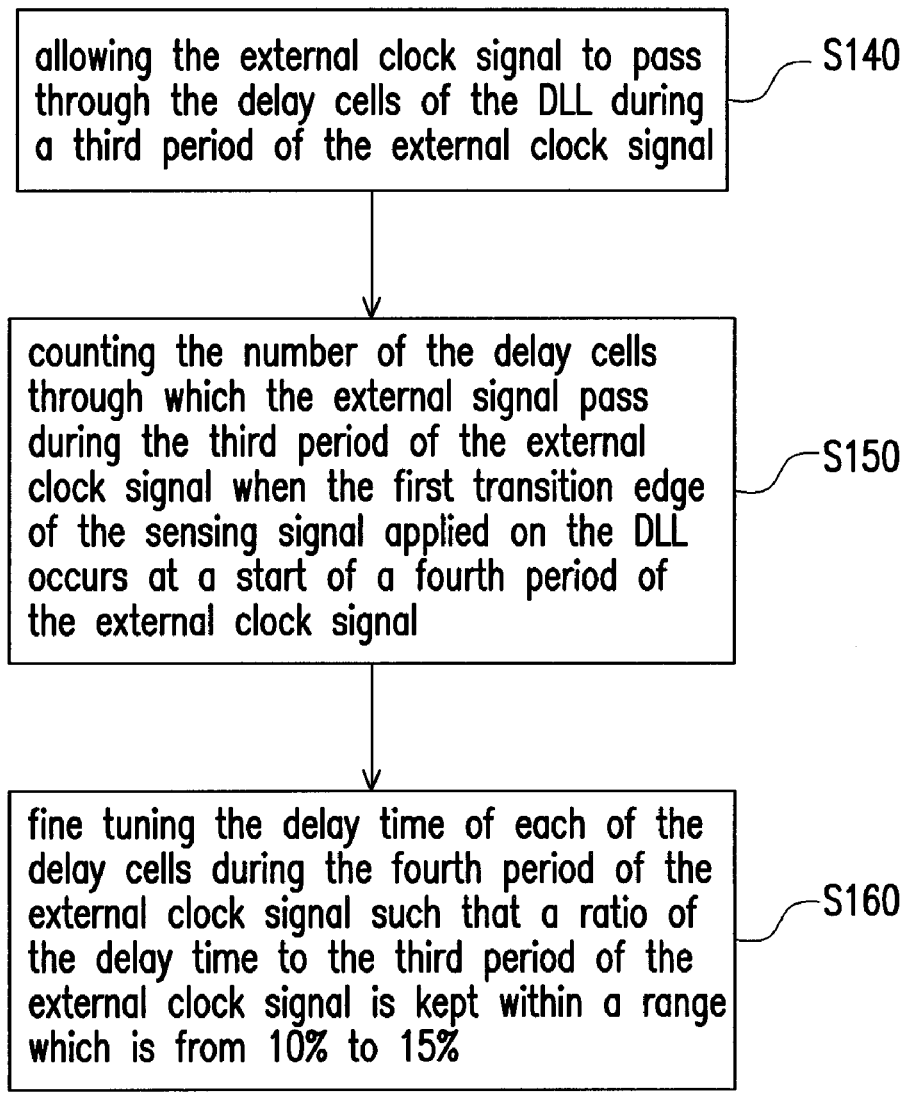
FIG. 3 is a flow chart of a method for tracking a delay locked loop (DLL) clock according to an embodiment of the invention.

FIG. 3 is a flow chart of a method for tracking a delay locked loop (DLL) according to an embodiment of the invention. Referring to both FIG. 3 and FIG. 2A, the method for tracking DLL further includes following steps. Namely, the external clock signal XCLK is allowed to pass through the delay cells of the DLL during a third period T3 of the external clock signal XCLK (step S140). As shown in FIG. 2A, an output, e.g. OP10, of the delay cell is changed from a logic low level state to a logic high level state when the external clock signal XCLK pass through the delay cell of the DLL during the third period T3 of the external clock signal XCLK.

Next, the number of the delay cells through which the external signal XCLK pass during the third period T3 of the external clock signal is counted when the first transition edge, e.g. a rising edge, of the sensing signal SS1 applied on the DLL occurs at a start of a fourth period T4 of the external clock signal XCLK (step S150). Finally, the delay time of each of the delay cells is fine tuned during the fourth period T4 of the external clock signal XCLK, such that a ratio of the delay time to the third period T3 of the external clock signal XCLK is kept within a range which is from 10% to 15% (step S160).

Since the ratio of the delay time to the first period T1 of the external clock signal XCLK has been reset during the second period T2, the ratio of the delay time to the third period T3 of the external clock signal XCLK is just required being fine tuned now. Thus, by resetting and fine tuning the ratio of the delay time to the period of the external clock signal XCLK, the ratio of the delay time to the period of the external clock signal XCLK is kept from 10% to 15% such that the external clock signal XCLK is able to be locked accurately. It is noted that the method for tracking the DLL clock in FIG. 1 is used to coarsely reset the delay time of the delay cells, and the method for tracking the DLL clock in FIG. 3 is used to fine tune the delay time of the delay cells. The method of FIG. 1 may be first applied on and executed in the DLL, and then the method of FIG. 3 may be applied on and executed in the DLL. Or alternatively, they may be separately applied on and executed in the DLL.

Figure 4:
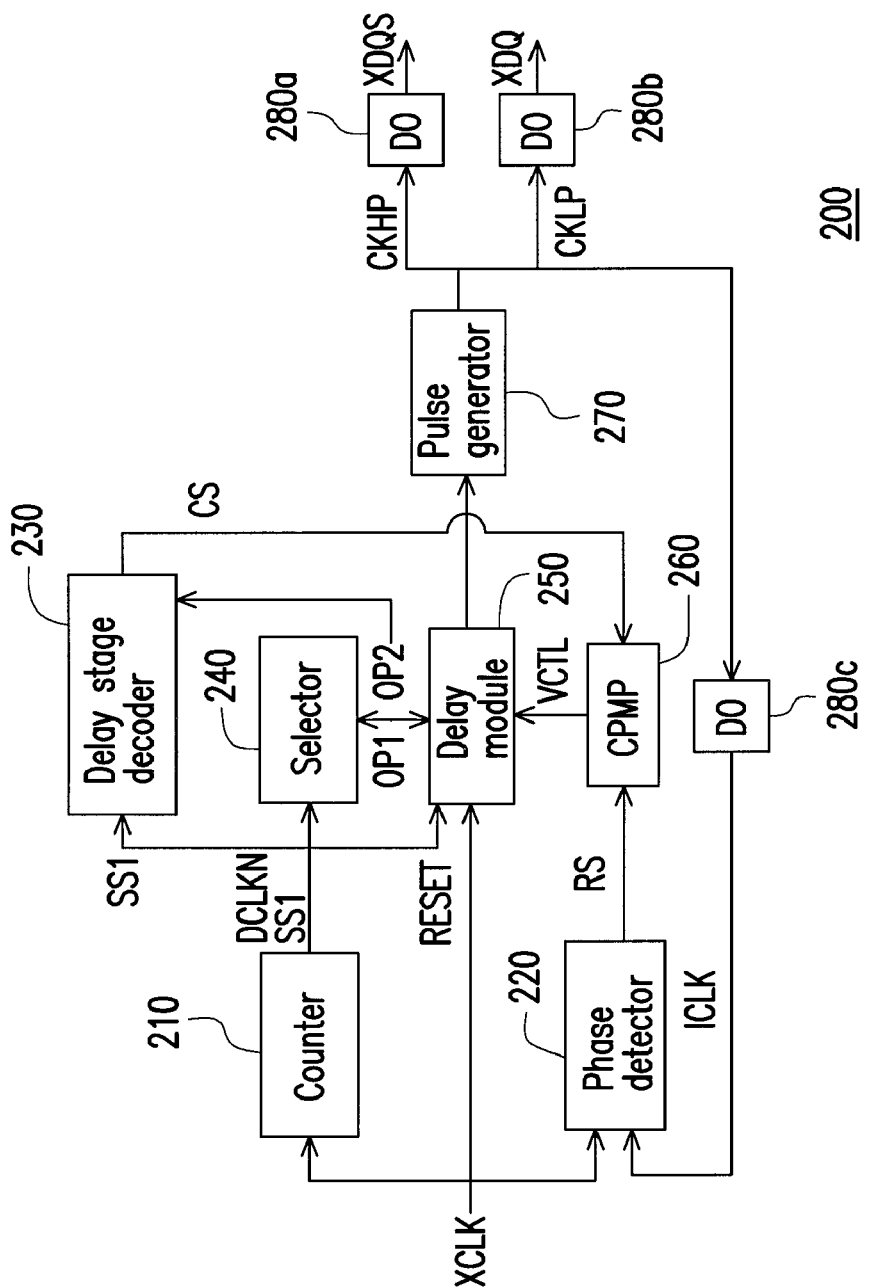
FIG. 4 is block diagram of a delay lock loop (DLL) having the function of tracking the external clock signal depicted in FIG. 1.

FIG. 4 is block diagram of a delay lock loop (DLL) having the function of tracking the external clock signal XCLK depicted in FIG. 1. As shown in FIG. 4, the DLL 200 includes a counter 210, a phase detector 220, a delay stage decoder 230, a selector 240, a delay module 250, and a charge pump (CPMP) 260. The delay module 250 includes a plurality of delay cells (not shown). The external clock signal XCLK is transmitted to the counter 210, the delay module 250 and the phase detector 220.

Referring to both FIGS. 2A and 4, when the first transition edge, e.g. a falling edge, of the track signal DCLKN applied on the delay module 250 occurs, the external clock signal XCLK is allowed to pass through the delay cells of the delay module 250 during the first period T1 of the external clock signal XCLK (step S110). Next, output signals, e.g. OP1~OP6, etc., of the delay cells of the delay module 250 are transmitted to the delay stage decoder 230 and the selector 240 during the first period T1 of the external clock signal XCLK, such that the number of the delay cells through which the external clock signal XCLK passes is able to be determined according to the logic level state of each of the output signals.

Referring to both FIG. 2A and FIG. 4, the counter 210 transmits the sensing signal SS1 having the first transition edge, e.g. a rising edge, to the delay stage decoder 230 and the selector 240, such that the external clock signal XCLK is inhibited to pass through the delay cells of the delay module 250 In the embodiment, the first transition edge occurs at the start of the second period T2 of the external clock signal XCLK as shown in FIG. 2A. Meanwhile, the number of the delay cells through which the external clock signal XCLK pass is counted by the selector 240 (step S120). In detail, the selector 240 decodes the output signals to know how many delay cells are used. Then, the delay stage decoder 230 adjusts the used number of the delay cells to about 10 stages and outputs a control signal CS to the CPMP 260, such that a voltage of the CPMP 260 is adjusted and then the voltage signal VCTL is generated. Therefore, the delay module 250 receives the voltage signal VCTL and resets the delay time of each of the delay cells according to the voltage signal VCTL, such that the ratio of the delay time to the external clock signal XCLK is kept within the range from 10% to 15% (step S130).

Then, during the third period T3 of the external clock signal XCLK, the external clock signal XCLK is allowed to pass through the delay cells of the delay module 250 (step S140). The selector 240 receives the outputs of the delay cells again and decodes the signals to know how many delay cells are used. The number of delay cells used is stored in this selector 240. When the first transition edge of the sensing signal SS1 occurs again at the start of the fourth period T4 of the external clock signal XCLK, the delay stage decoder 230 takes the number of the delay cells through which the external clock signal XCLK pass during the third period T3 of the external clock signal XCLK (step S150). Thereafter, the phase detector 220 compares the frequency of the external clock signal XCLK and the frequency of the internal clock signal ICLK, and then outputs a result signal RS to the CPMP 260. Thus, the CPMP 260 then generates the voltage signal VCTL according to the result signal RS and the control signal CS of the delay stage decoder 230. As a result, the delay module 250 is able to fine tunes the delay time of each of the delay cells during the fourth period T4 of the external clock signal XCLK, such that the ratio of the delay time to the period of the external clock signal XCLK is kept within the range from 10% to 15% (step S160).

Moreover, the information of the number of the delay cells is stored in the selector 240 and not changed again. Besides, a pulse generator 270 generates a pulse according to the state of the output signal of the delay module 250. Specifically, the pulse generator 270 generates a pulse CKHP at rising edge of the output signal of the delay module 250 and a pulse signal CKLP at the falling edge of the output signal of the delay module 250. Then, a circuit macros (DO) 280a outputs a signal XDQS according to the pulse CKHP and a circuit macros (DO) 280b outputs data signal XDQ according to the pulse CKLP at the same time.

In light of the foregoing, the method for tracking a delay locked loop (DLL) clock of the embodiment resets the delay time of each of the delay cells of the DLL during a certain period of the external clock XCLK, such that the ratio of the delay time to the period of the external clock XCLK is kept within the range from 10% to 15% and the number of the delay cells is remained about 10 stages. Thus, the DLL using the method of the embodiment is able to lock the external clock signal XCLK accurately and the power consumption of the DLL is controlled as well.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for tracking a delay locked loop (DLL) clock and adapted to a DDL, comprising:
    allowing an external clock signal to pass through delay cells of the DLL during a first period of the external clock signal when a first transition edge of a track signal applied on the DLL occurs;
    inhibiting the external clock signal to pass through the delay cells of the DLL and counting the number of the delay cells through which the external clock signal pass during the first period of the external clock signal when a first transition edge of a sensing signal applied on the DLL occurs at a start of a second period of the clock external signal; and
    resetting a delay time of each of the delay cells such that a ratio of the delay time to the first period of the external clock signal is kept within a range when a reset signal is asserted, wherein whether the reset signal is asserted is triggered by the first transition edge of the sensing signal and the range is from 10% to 15%.

2. The method of claim 1, wherein the first transition edge of the sensing signal occurs at a start of the second period of the clock signal, a second transition edge of the sensing signal occurs during the second period of the external clock signal, a second transition edge of the track signal occurs at the start of the second period of the external clock signal, the first transition edge of the track signal occurs at the end of the second period of the external clock signal, and the reset signal is not asserted at the end of the second period of the external clock signal.

3. The method of claim 2, wherein when the first transition edge of the track signal is a falling edge, the second transition edge of the track signal is a rising edge; or when the first transition edge of the track signal is a rising edge, the second transition edge of the track signal is a falling edge.

4. The method of claim 2, wherein when the first transition edge of the sensing signal is a falling edge, the second transition edge of the sensing signal is a rising edge; or when the first transition edge of the sensing signal is a rising edge, the second transition edge of the sensing signal is a falling edge.

5. The method of claim 2, wherein when the reset signal is at a logic high level state during the second period of the external clock signal, the reset signal is at a logic low level state during the first period of the external clock signal; or when the reset signal is at the logic low level state during the second period of the external clock signal, the reset signal is at the logic high level state during the first period of the external clock signal.

6. The method of claim 1, wherein each of the delay cells receives a voltage signal to reset the delay time thereof.

7. The method of claim 1, further comprising:
    allowing the external clock signal to pass through the delay cells of the DLL during a third period of the external clock signal;
    counting the number of the delay cells through which the external clock signal pass during the third period of the external clock signal when the first transition edge of the sensing signal applied on the DLL occurs at a start of a fourth period of the external clock signal; and
    fine tuning the delay time of each of the delay cells during the fourth period of the external clock signal such that a ratio of the delay time to the third period of the external clock signal is kept within a range which is from 10% to 15%.

8. The method of claim 7, wherein when the first transition edge of the sensing signal is a falling edge, the second transition edge of the sensing signal is a falling edge; or when the first transition edge of the sensing signal is a rising edge, the second transition edge of the sensing signal is a raising edge.

9. The method of claim 1, wherein when the external clock signal passes through one of the delay cells, an output signal of the delay cell is changed from a logic low level state to a logic high level state.

10. A method for tracking a delay locked loop (DLL) clock and adapted to a DDL, comprising:
    allowing an external clock signal to pass through delay cells of the DLL during a first period of the external clock signal when a first transition edge of a track signal applied on the DLL occurs;
    inhibiting the external clock signal to pass through the delay cells of the DLL when a first transition edge of a sensing signal applied on the DLL occurs at a start of a second period of the clock external signal and a $x^{th}$ delay cell of the delay cells is remained at a first state during the first period of the external clock signal, wherein x is an integer larger than 5; and resetting a delay time of each of the delay cells such that a ratio of the delay time to the first period of the external clock signal is kept within a range when a reset signal is asserted, wherein whether the reset signal is asserted is triggered by the first transition edge of the sensing signal and the state of the $x^{th}$ delay cell during the first period of the external clock signal, and the range is from 10% to 15%.

11. The method of claim 10, wherein the first transition edge of the sensing signal occurs at a start of the second period of the clock signal, a second transition edge of the sensing signal occurs during the second period of the external clock signal, a second transition edge of the track signal occurs at the start of the second period of the external clock signal, the first transition edge of the track signal occurs at the end of the second period of the external clock signal, and the reset signal is not asserted at the end of the second period of the external clock signal.

12. The method of claim 11, wherein when the first transition edge of the track signal is a falling edge, the second transition edge of the track signal is a rising edge; or when the first transition edge of the track signal is a rising edge, the second transition edge of the track signal is a falling edge.

13. The method of claim 11, wherein when the first transition edge of the sensing signal is a falling edge, the second transition edge of the sensing signal is a rising edge; or when the first transition edge of the sensing signal is a rising edge, the second transition edge of the sensing signal is a falling edge.

14. The method of claim 11, wherein when the reset signal is at a logic high level state during the second period of the external clock signal, the reset signal is at a logic low level state during the first period of the external clock signal; or when the reset signal is at the logic low level state during the second period of the external clock signal, the reset signal is at the logic high level state during the first period of the external clock signal.

15. The method of claim 10, wherein each of the delay cells receives a voltage signal to reset the delay time thereof.

16. The method of claim 10, further comprising:

allowing the external clock signal to pass through the delay cells of the DLL during a third period of the external clock signal;

counting the number of the delay cells through which the external clock signal pass during the third period of the external clock signal when the first transition edge of the sensing signal applied on the DLL occurs at a start of a fourth period of the external clock signal; and fine tuning the delay time of each of the delay cells during the fourth period of the external clock signal such that a ratio of the delay time to the third period of the external clock signal is kept within a range which is from 10% to 15%.

17. The method of claim 16, wherein when the first transition edge of the sensing signal is a falling edge, the second transition edge of the sensing signal is a falling edge; or when the first transition edge of the sensing signal is a rising edge, the second transition edge of the sensing signal is a raising edge.

18. The method of claim 10, wherein when the external clock signal passes through one of the delay cells, an output signal of the delay cell is changed from a logic low level state to a logic high level state.

* * * * *